United States Patent [19]
Robin

[11] Patent Number: 5,745,848
[45] Date of Patent: Apr. 28, 1998

[54] METHOD AND APPARATUS FOR ELIMINATING INTERFERENCE CAUSED BY SPURIOUS SIGNALS IN A COMMUNICATION DEVICE

[75] Inventor: John F. Robin, Westmont, Ill.

[73] Assignee: Motorola, Inc., Schaumburg, Ill.

[21] Appl. No.: 610,028

[22] Filed: Mar. 4, 1996

[51] Int. Cl.$^6$ ............................................. H04B 1/10
[52] U.S. Cl. ..................... 455/296; 455/77; 455/133; 455/183.1
[58] Field of Search ............................. 455/75, 76, 77, 455/87, 133, 165.1, 183.1, 186.1, 260, 296, 310, 316, 317

[56] References Cited

U.S. PATENT DOCUMENTS

| | | |
|---|---|---|
| 4,545,072 | 10/1985 | Skutta et al. |
| 4,661,995 | 4/1987 | Kashiwagi |
| 4,879,758 | 11/1989 | DeLuca et al. |
| 4,887,050 | 12/1989 | Borth et al. |
| 5,093,632 | 3/1992 | Hietala et al. |
| 5,111,162 | 5/1992 | Hietala et al. |
| 5,166,642 | 11/1992 | Hietala et al. |
| 5,212,826 | 5/1993 | Rabe et al. |
| 5,212,833 | 5/1993 | Suda et al. |
| 5,225,792 | 7/1993 | Prakash |
| 5,263,055 | 11/1993 | Cahill |
| 5,493,700 | 2/1996 | Hietala et al. |

FOREIGN PATENT DOCUMENTS

| | | |
|---|---|---|
| 2194696 | 3/1988 | United Kingdom |
| 2250877 | 6/1992 | United Kingdom |
| 2276784 | 10/1994 | United Kingdom |
| 2292867 | 3/1996 | United Kingdom |

*Primary Examiner*—Reinhard J. Eisenzopf
*Assistant Examiner*—G. Arthur
*Attorney, Agent, or Firm*—Mark D. Patrick

[57] ABSTRACT

An apparatus for eliminating interference caused by spurious signals includes a reference oscillator (127) and a controller (114). Circuitry (500) in a communication device (104) incorporating the apparatus operates at a rate set by a system clock signal (CLOCK). The communication device (104) communicates on any one of a plurality of different channels. The reference oscillator (127) outputs the system clock signal (CLOCK) at a first frequency which generates spurious signals on at least one of the plurality of different channels. The controller (114) shifts the system clock signal (CLOCK) by a first predetermined amount to a second frequency when the communication device (104) is to be tuned to the at least one of the plurality of different channels so as to remove the spurious signals from the at least one of the plurality of different channels.

17 Claims, 5 Drawing Sheets

METHOD AND APPARATUS FOR ELIMINATING INTERFERENCE CAUSED BY SPURIOUS SIGNALS IN A COMMUNICATION DEVICE

FIELD OF THE INVENTION

The present invention relates generally to communication devices and, more particularly, to interference caused by spurious signals in communication devices.

BACKGROUND OF THE INVENTION

Electronic devices employ circuits operating at a rate set by a system clock. The system clock is set by a quartz crystal-based reference oscillator. To insure that the system clock is precise, the reference oscillator typically is tuned. The system clock is used by logic circuitry throughout the electronic device to ensure that they operate in synchronization.

A problem with such devices is that the system clock generates unwanted spurious signals that interfere with the decoding of information from received signals by a receiver of the communication device. For example, a communication device operating in the GSM (Group Special Mobile) radiotelephone system employs a 13 MHz system clock. The 72nd and 73rd harmonics of the 13 MHz system clock are within the GSM downlink channels 5 and 70. When the communication device is tuned to channel 5 or channel 70, the harmonics of the system clock are radiated into the receiver of the communication device. The spurious energy causes the receiver to become desensitized to the information in the received signal resulting in substantial performance degradation in the form of high bit error rates.

Existing methods for reducing receiver desensitization caused by the harmonics of the system clock include shielding the transceiver of the communication device with additional material. For example, silver paint, conductive gaskets, beryllium copper fingers, and filters for filtering the clock signal can be employed in the communication device. However, such materials add weight, size, and cost to the communication device and require time-consuming circuit board redesigns and manual manufacturing operations. Such manual manufacturing operations can include manual soldering of antenna assemblies, manual placement of gaskets, and desensitization testing.

Therefore, what is needed is a method and apparatus for eliminating interference from spurious signals generated by the system clock and circuits driven thereby.

DETAILED DESCRIPTION OF THE PREFERRED EMBODIMENTS

An apparatus for eliminating interference caused by spurious signals includes a reference oscillator and a controller. Circuitry in a communication device incorporating the apparatus operates at a rate set by a system clock signal. The communication device communicates on any one of a plurality of channels via communication signals. The reference oscillator outputs the system clock signal at a first frequency. Harmonics of the first frequency are spurious signal energy on at least one of the plurality of channels. The controller shifts the system clock signal by a predetermined amount when the communication device is to be tuned to the at least one of the plurality of different channels. Shifting the system clock in this manner for these signals having a frequency of a harmonic of the system clock frequency removes the spurious signal energy from the at least one of the plurality of different channels.

Figure 1:
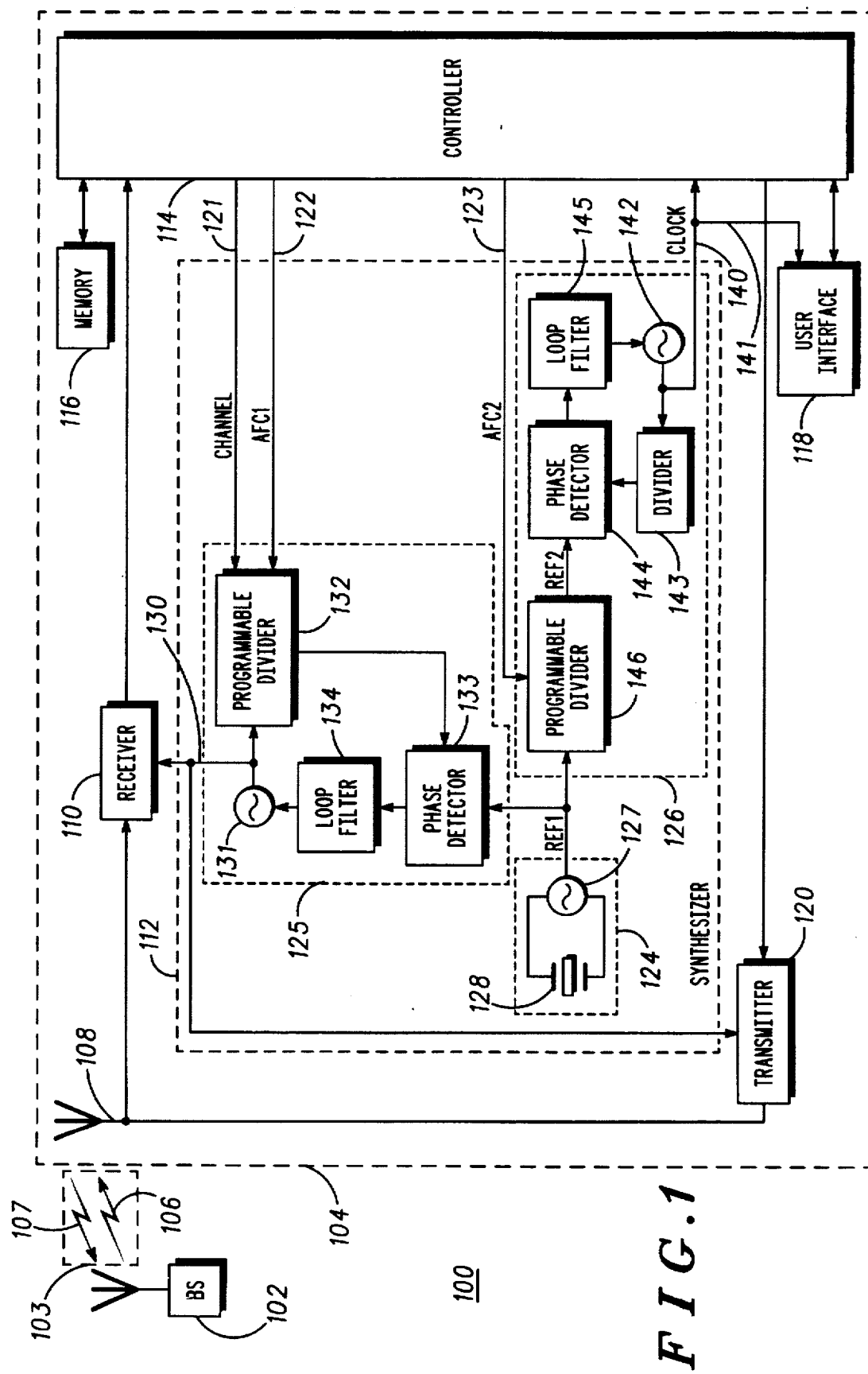
FIG. 1 is a block diagram illustrating a communication system employing a communication device.

FIG. 1 illustrates communication system 100. Communication system 100 includes communication devices 102 and 104 that communicate over a communication link 103. Communication devices 102 and 104 can be two-way radios, cellular radiotelephones, cordless telephones, radios, base stations, radio transmitters, or the like. The communication link 103 can be a wireless connection, a wireline connection such as a twisted wire pair, a coaxial cable, or the like. In the illustrated embodiment, communication device 102 is a cellular base station and communication device 104 is a cellular radiotelephone compatible with the base station. In the illustrated embodiment, communication link 103 includes downlink radio frequency (RF) signal 106 and uplink RF signal 107.

Communication device 102 provides service to communication devices, such as communication device 104, contained within a particular geographic area. Communication device 102 sends voice audio, data, and frequency reference and synchronization information to communication device 104 on one of a plurality of downlink channels as downlink RF signal 106. Communication device 102 receives data from communication device 104 on one of a plurality of uplink channels as uplink RF signal 107.

Communication device 104 includes antenna 108, receiver 110, synthesizer 112, controller 114, memory 116, user interface 118, and transmitter 120. Controller 114 programs synthesizer 112 to tune receiver 110 to one of the plurality of downlink channels via a channel select signal CHANNEL on line 121. Controller 114 forms the channel select signal from channel data stored in memory 116. Downlink RF signal 106 is received by tuned receiver 110 via antenna 108 and coupled to controller 114. Controller 114 extracts the voice audio, the data, the frequency reference information, and the synchronization information from downlink RF signal 106. The frequency reference information informs controller 114 of tuning error attributable to synthesizer 112. Controller 114 subsequently corrects the error via automatic frequency control (AFC) signals AFC1 and AFC2 on lines 122 and 123, respectively. Controller 114 couples voice audio and data contained in downlink RF signal 106 to user interface 118 for output. Controller 114 is responsive to information input thereto to control synthesizer 112 to tune transmitter 120 to one of the plurality of uplink channels. Transmitter 120 transmits the information as uplink RF signal 107.

Synthesizer 112 includes reference oscillator circuit 124, tuning circuit 125, and clock circuit 126. Reference oscillator circuit 124 includes reference oscillator 127 and crystal 128. Reference oscillator 127 generates a reference frequency REF1 based on the natural frequency of crystal 128. In the illustrated embodiment, crystal 128 is free-running and untuned. As such, REF1 is not precisely accurate and causes tuning error in synthesizer 112. Alternatively, reference oscillator circuit 124 could be tuned such that REF1 has a precise predetermined frequency. Other reference oscillators can be used.

Tuning circuit 125 includes voltage controlled oscillator (VCO) 131, programmable divider 132, phase detector 133, and loop filter 134 connected in a phase lock loop fed by REF1. VCO 131 outputs an accurate local oscillator signal on line 130 that tunes receiver 110 or transmitter 120 to a particular downlink or uplink channel, respectively. The local oscillator signal is adjusted by programmable divider 132. Programmable divider 132 is a fractional divider that generates a frequency division ratio from the channel select signal and AFC1 provided by controller 114 via lines 121 and 122, respectively. The channel select signal denotes the particular channel to be tuned to and AFC1 indicates the amount of compensation required for any inaccuracy in REF1 relative to a predetermined frequency. The channel select signal and AFC1 are generated in a known manner and will not be described herein for brevity. Programmable divider 132 applies the frequency division ratio to the local oscillator signal fedback from VCO 131 to form a divided down local oscillator signal at the output of programmable divider 132. Phase detector 133 compares the divided down local oscillator signal with REF1 from reference oscillator circuit 124. The phase difference between the divided down local oscillator signal from programmable divider 132 and REF1 is output from phase detector 133 and coupled through loop filter 134 to drive VCO 131.

Clock circuit 126 includes VCO 142, divider 143, phase detector 144, and loop filter 145 connected in a phase lock loop fed by REF1 via programmable divider 146, also of clock circuit 126. VCO 142 outputs a system clock signal CLOCK on lines 140 and 141. The system clock signal synchronizes operation of logic circuitry of controller 114 and user interface 118. The system clock signal is adjusted by programmable divider 146. Programmable divider 146 generates a frequency division ratio from AFC2 provided by controller 114 via line 123. AFC2 indicates the amount of compensation required for correcting any inaccuracy in REF1. Programmable divider 146 divides the frequency division ratio to form a lower reference frequency REF2. Phase detector 144 compares REF2 with a divided down system clock signal output by divider 143. The phase difference between the divided down system clock signal and REF2 is output from phase detector 144 and coupled through loop filter 145 to drive VCO 142.

Programmable dividers 132 and 146 are, preferably, of the fractional-N type, which utilize multiple latched accumulators (not shown) to perform multiple integrals of data received at a control input coupled to controller 114 by lines 121, 122, and 123. The multiple integrals are output from the latched accumulators and combined in series to form the frequency division ratio. The frequency division ratio is varied with a periodic sequence such that the signal at its input is adjusted in frequency steps. Such fractional-N type dividers are described in both U.S. Pat. No. 5,166,642, entitled "Multiple Accumulator Fractional N Synthesis With Series Recombination," by Hietala, granted on Nov. 24, 1992, assigned to Motorola, Inc., the assignee of the present application, and U.S. Pat. No. 5,493,700, entitled "Automatic Frequency Control Apparatus," by Hietala et al., granted on Feb. 20, 1996, and assigned to Motorola, Inc., the assignee of the present application, which are incorporated herein by reference thereto. However, it will be recognized that other commercially available dividers could be employed to implement programmable dividers 132 and 146.

Receiver 110 suffers from degraded performance when tuned to particular downlink channels. The degraded performance is caused by spurious signals generated by the system clock signal and radiated by logic circuitry of controller 114, memory 116, and user interface 118. These spurious signals, harmonics of the system clock signal, are within the frequency band of the particular downlink channels. For example, the GSM standard utilizes downlink channels 1 through 124 in a frequency band from 935 MHz to 960 MHz. Each downlink channel is spaced 200 kHz apart. Many products employing the GSM standard use a system clock signal of 13 MHz. The 72nd and 73rd harmonics of the 13 MHz system clock signal are within downlink channels 5 (centered on 936 MHz) and 70 (centered on 949 MHz), respectively. Therefore, when the receiver of these GSM communication devices are tuned to channel 5 or channel 70, the 72nd or 73rd harmonic, respectively, is communicated into receiver 110 causing interference. Prior art methods of combating this problem, which include extensively shielding the receiver of the GSM communication device with additional material, add weight, size, and cost to the communication device.

Figure 2:
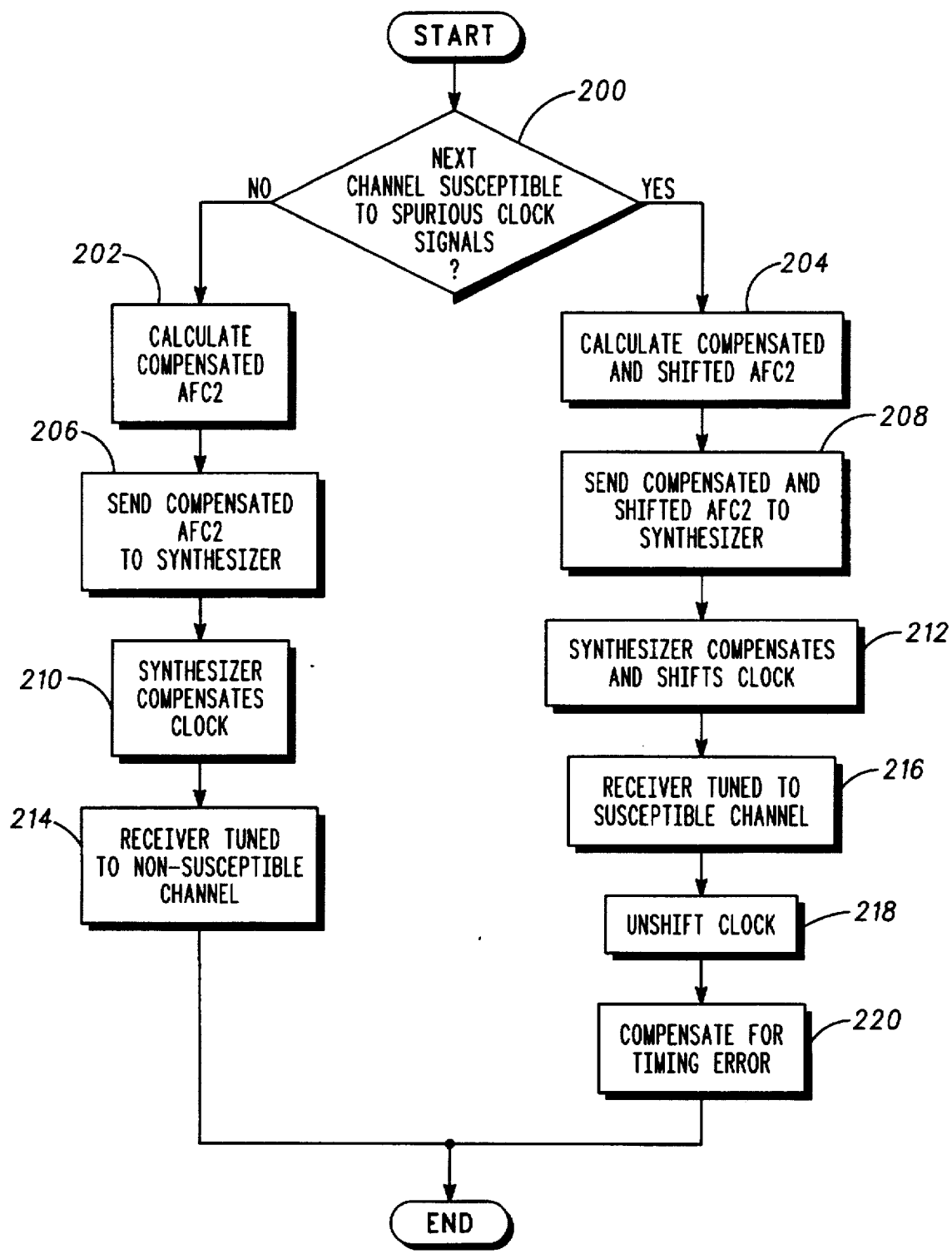
FIG. 2 is a flowchart illustrating a method employed by the communication device of FIG. 1 to eliminate interference caused by spurious clock signals.

An improved method for minimizing interference caused by spurious signals of a system clock signal is illustrated in FIG. 2 and will be described with respect to elements in FIG. 1 and FIG. 3. The method is performed by controller 114 via instructions stored in memory 116, synthesizer 112, and receiver 110. Memory 116 can be any combination of random access memory (RAM), read-only memory (ROM), erasable programmable read-only memory (EPROM), electrically erasable programmable read-only memory (EEPROM), or the like.

At block 200 (FIG. 2), controller 114 determines if the next downlink channel to be tuned to is susceptible to spurious signals of the system clock signal, such as a harmonic of the system clock signal. In the GSM system, communication device 104 operates in synchronization with communication device 102 according to a timing format illustrated in FIG. 3. The GSM timing format consists of a plurality of repeating frames. Each frame has a duration of $T_F$, which is 4.615 ms. Each frame consists of eight timeslots, numbered 0–7. Each timeslot has a duration of $T_S$, which is 577 µs. During timeslot 0 of each frame, communication device 104 is tuned to a downlink channel to receive downlink RF signal 106. Therefore, the determination at block 200 of FIG. 2 is performed during a timeslot, such as timeslot 6 or 7, preceding timeslot 0.

Figure 3:
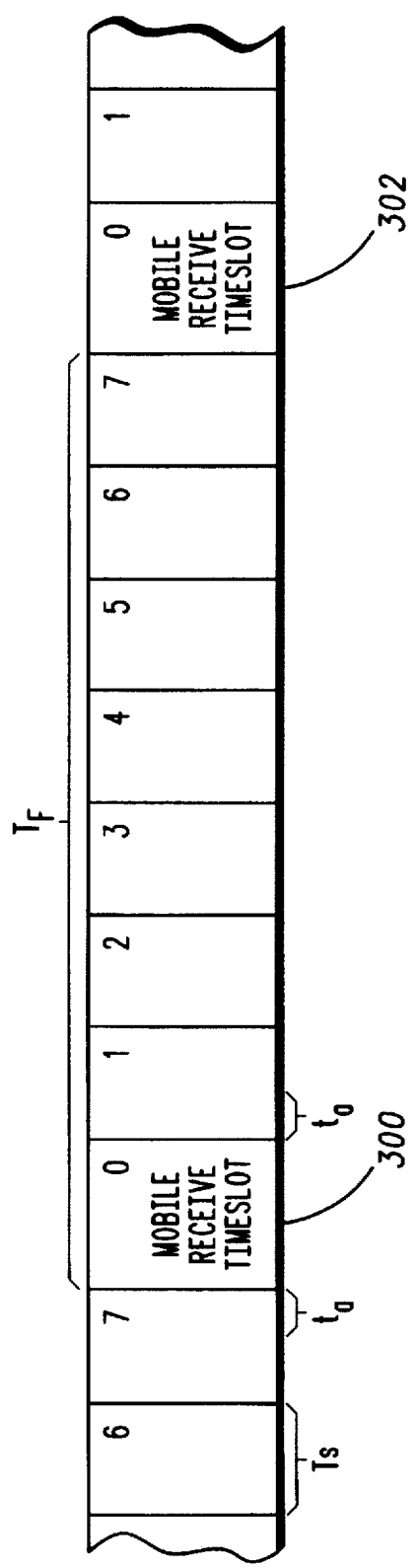
FIG. 3 is a timing format followed by the communication device of FIG. 1.

Responsive to the determination in block 200, controller 114 calculates the value of AFC2 at blocks 202 (FIG. 2) and 204 prior to timeslot 0 of FIG. 3. The value of AFC2 is calculated according to an equation, such as, $$AFC2 = CONSTANT * COMPENSATION\_FACTOR * SHIFT\_FACTOR \quad (1)$$

where,

CONSTANT is a nominal divider value;

COMPENSATION_FACTOR compensates for an inaccuracy in REF1 relative to a predetermined standard clock frequency STD_CLOCK desired for the system clock signal, and is further described by:

$$REF1(MHz)/STD\_CLOCK(MHz);$$

and

SHIFT_FACTOR shifts the system clock signal from the standard frequency, and is further described by:

CHAN(MHz)/[CHAN)(MHz)+SHIFT)(MHz)]

where,

CHAN is the center frequency of the downlink channel to be tuned to, and

SHIFT is the amount of shift necessary to move the spurious signal off-channel.

Applying the above, Equation (1) becomes, $$AFC2 = CONSTANT * [REF1(MHz)/STD\_CLOCK(MHz)] * \quad (2)$$
$$[CHAN(MHz)/[CHAN(MHz) + SHIFT(MHz)]].$$

If the downlink channel is not susceptible to spurious signals, AFC2 will only compensate for the inaccuracy of REF1 relative to STD_CLOCK. AFC2 will not include a value for SHIFT. At block 202 of FIG. 2, controller 114 calculates the value of AFC2 for a non-susceptible channel as follows:

assuming,

CONSTANT=65,

REF1=12.95 MHz,

STD_CLOCK=13 MHz,

CHAN=936.2 MHz (channel 6 in the GSM system), and

SHIFT=0, $$AFC2 = 65 \times \quad (3)$$
$$[12.95 \text{ MHz}/13 \text{ MHz}] * [936.2 \text{ MHz}/936.2 \text{ MHz} + 0]$$
$$= 64.75.$$

If the downlink channel is susceptible to spurious signals, AFC2 will compensate for any inaccuracy of REF1 and it will shift the system clock signal to move the spurious signal out of the selected channel. At block 204 of FIG. 2, controller 114 calculates the value of AFC2 for a susceptible channel as follows:

assuming,

CONSTANT=65,

REF1=12.95 MHz,

STD_CLOCK=13 MHz,

CHAN=936 MHz (downlink channel 5 in the GSM system), and

SHIFT=200 kHz=0.2 MHz, $$AFC2 = 65 \times \quad (4)$$
$$[12.95 \text{ MHz}/13 \text{ MHz}] * [936.2 \text{ MHz}/(936 \text{ MHz} + 0.2 \text{ MHz})]$$
$$= 63.7362$$

for CHAN=949 MHz (downlink channel 70 in the GSM system), $$AFC2 = 65 \times \quad (5)$$
$$[12.95 \text{ MHz}/13 \text{ MHz}] * [949 \text{ MHz}/(949 \text{ MHz} + 0.2 \text{ MHz})]$$
$$= 63.7364.$$

For both non-susceptible and susceptible channels, AFC2 is sent by controller 114 to synthesizer 112, at blocks 206 and 208 of FIG. 2, during timeslot 7 in FIG. 3. Clock circuit 126 of synthesizer 112 requires a time $t_a$ to adjust the system clock signal. Controller 114 sends AFC2 at a time $T_S-t_a$ after the start of timeslot 7, and at a time $t_a$ before the start of timeslot 0 in FIG. 3 so as to assure that the system clock signal is adjusted by the start of timeslot 0. For illustrated purposes, $t_a$ may, for example, be approximately 200 μs. AFC2 may be sent simultaneously with channel select signal and AFC1, such that receiver 110 is accurately tuned to the non-susceptible or susceptible channel by the start of timeslot 0.

If it was determined in decision block 200 that the channel to be tuned to is non-susceptible, during time $t_a$ of timeslot 7 in FIG. 3 synthesizer 112 adjusts the system clock signal, CLOCK, at block 210 of FIG. 2. At block 210, for a non-susceptible channel, such as channel 6, programmable divider 146 is programmed with a divider value of 64.75 by AFC2 as calculated using Equation (3). Once programmed, programmable divider 146 divides REF1 of 12.95 MHz by 64.75 to produce REF2 with an accurate frequency of 0.2 MHz. REF2 drives the phase lock loop of clock circuit 126 to form the system clock signal having an accurate frequency of 13 MHz.

At block 214 of FIG. 2 and during timeslot 0 in FIG. 3, receiver 110 remains tuned to the selected channel without experiencing interference from spurious signals generated by the 13 MHz system clock signal and circuitry in controller 114, memory 116, and user interface 118. The 72nd and 73rd harmonics of the 13 MHz system clock signal reside at 936 MHz and 949 MHz, respectively. These frequencies fall outside the bandwidth of the selected channels to which receiver 110 is currently tuned.

If it was determined in decision block 200 that the channel to be tuned to is susceptible, during time $t_a$ of timeslot 7 in FIG. 3 synthesizer 112 adjusts the system clock signal, CLOCK, at block 212 of FIG. 2. At block 212, for a susceptible channel, such as channel 5 or channel 70, programmable divider 146 of clock circuit 126 is programmed with a divider value 63.7362 for channel 5 or 63.7364 for channel 70 by AFC2 as calculated using Equation (4) or (5). For channel 5, programmable divider 146 divides REF1 of 12.95 MHz by 64.7362 to produce REF2 with an accurate, shifted frequency of 0.200043 MHz. For channel 70, programmable divider 146 divides REF1 of 12.95 MHz by 64.7364 to produce REF2 with an accurate, shifted frequency of 0.200042 MHz. REF2 drives the phase lock loop of clock circuit 126 to form the system clock signal with an accurate, shifted frequency of 13.0028 MHz for channel 5 and 13.0027 MHz for channel 70.

At block 216 of FIG. 2 and throughout timeslot 0 in FIG. 3, receiver 110 remains tuned to the selected channel without experiencing interference from spurious signals generated by the system clock signal and circuitry in controller 114, memory 116, and user interface 118. The 72nd and 73rd harmonics of the system clock signal at 13.0028 MHz or 13.0027 MHz reside at 936.2 MHz or 949.2 MHz, respectively. These frequencies are outside of the bandwidth of the selected channels to which receiver 110 is currently tuned. Accordingly, receiver 110 is not desensitized by harmonics of the system clock signal.

The effect of AFC2 on REF1, REF2, CLOCK (the system clock signal), and SPUR (the spurious harmonic of the system clock signal) for CHANs 5, 6, and 70 is shown in TABLE below.

TABLE

| CHAN # | CFREQ (MHz) | REF1 (MHz) | AFC2 | REF2 (MHz) | CLOCK (MHz) | SPUR (MHz) |
|---|---|---|---|---|---|---|
| 5 | 936 | 12.95 | 64.7362 | 0.200043 | 13.0028 | 936.2 |
| 6 | 936.2 | 12.95 | 64.75 | 0.2 | 13 | 936 |
| 70 | 949 | 12.95 | 64.7364 | 0.200042 | 13.0027 | 949.2 |

It will be recognized that the system clock signal could alternatively be shifted down in frequency at block 212 of FIG. 2 so as to operate at a frequency lower that the STD_CLOCK rate. To do so, SHIFT of Equation (2) could, for example, be set to −200 kHz.

For susceptible channels, the system clock signal must be unshifted at the conclusion of timeslot 0 to minimize timing error. At block 218 of FIG. 2, and at the beginning of timeslot 1 in FIG. 3, controller 114 sends AFC2 to unshift the system clock signal. At block 218, Controller 114 re-performs blocks 202, 206, 210. AFC2 is calculated as if the channel to be tuned to is not susceptible to spurious clock signals (i.e., according to Equation (3)). Controller 114 sends AFC2 to synthesizer 112 at the start of timeslot 1 in FIG. 3. Synthesizer 112, responsive to AFC2, adjusts the system clock signal to its standard value, such as 13 MHz, over time $t_a$, which may be, for example, 200 µs. The system clock signal is unshifted by the end of time $t_a$ and after the start of timeslot 1. As such, for a susceptible channel, the system clock signal remains shifted for a total time of $T_S+t_a$ or approximately 577 µs+200 µs or 777 µs.

To minimize the accumulation of timing error and loss of synchronization between communication devices 102 and 104, controller 114 compensates for the amount of time $(T_S+t_a)$ that the system clock signal is shifted at block 220 of FIG. 2. In the GSM system, timing error is measured in fractions of a bit duration. In the illustrated embodiment, controller 114 performs a timing error correction algorithm that compensates for timing errors accumulating at a rate of up to approximately 25% of one bit per second. As stated, the duration of one frame is $T_F$, or 4.615 ms or 0.004615 secs. As such, controller 114 can compensate if the timing error does not exceed 25% of one bit within an interval of approximately 217 frames. Shifting the system clock signal for the time period of $T_S+t_a$ results in the loss of approximately 4.5% of one bit per frame, or about 10 bits per second. The rate at which timing error accumulates will exceed 25% of one bit duration per second after the system clock signal has been shifted for approximately 6 frames out of approximately 217 consecutive frames.

Figure 4:
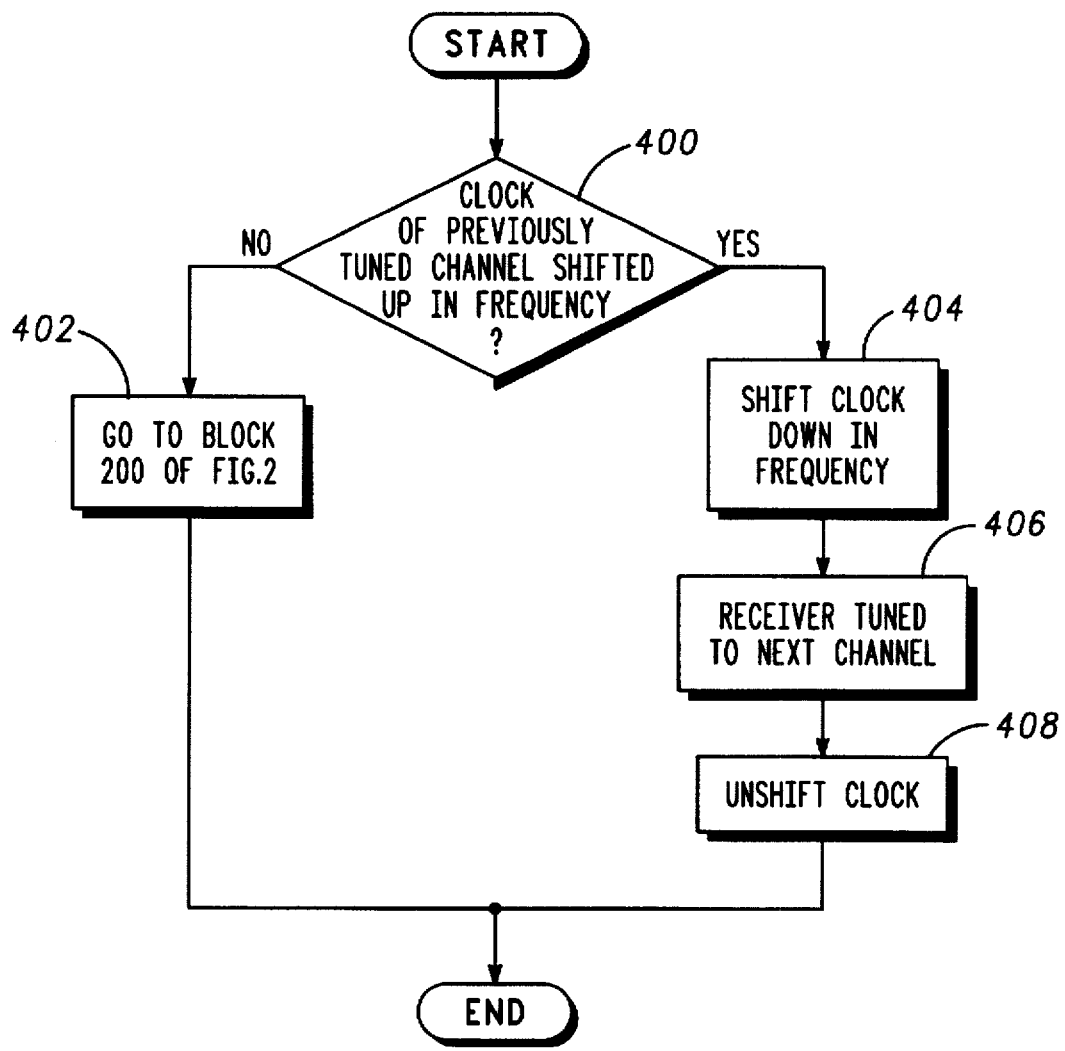
FIG. 4 is a flowchart illustrating a method employed by communication device of FIG. 1 to compensate for accumulation of timing error.

Timing error is compensated by alternating the direction of the frequency shift of the system clock signal over successive frames according to a method illustrated in FIG. 4. The method is executed by controller 114 via instructions stored in memory 116, synthesizer 112, and receiver 110. At block 400 of FIG. 4, controller 114 determines if the system clock signal was shifted to a greater frequency, such as 13.0028 MHz for channel 5 or 13.0028 MHz for channel 70, during a previous timeslot, such as timeslot 0 in FIG. 3, identified as 300. If the system clock signal was not shifted up in frequency, controller 114 proceeds to block 200 of FIG. 2 as indicated in block 402 of FIG. 4. If the system clock signal was shifted up in frequency, controller 114 proceeds to block 404.

At block 404, and during timeslot 0 in FIG. 3 denoted by 302, controller 114 shifts the system clock signal so that it operates at a lower frequency than STD_CLOCK. It will be recognized that the compensation could occur in another timeslot and need not be during a receive timeslot. In block 404, controller 114 generates AFC2 with negative SHIFT, such as −200 kHz or −0.2 MHz. Assuming CHAN 936.2 MHz, controller 114 calculates, $$AFC2 = 65 \times [12.95 \text{ MHz}/13 \text{ MHz}] * [936.2 \text{ MHz}/(936.2 \text{ MHz} - 0.2 \text{ MHz})]$$
$$= 64.7638.$$

Programmable divider 146 of clock circuit 126 is programmed with a divider value 64.7638. Programmable divider 146 divides down REF1 of 12.95 MHz by 64.7638 to produce REF2 with an accurate, shifted frequency of 0.199957 MHz. REF2 drives the phase lock loop of clock circuit 126 to form the system clock signal with an accurate, shifted frequency of 12.9972 MHz.

At block 406, and throughout timeslot 302 of FIG. 3, receiver 110 remains tuned to CHAN. Receiver 110 does not experience interference from spurious signals generated by the system clock signal because its harmonics are off-channel.

At block 408, and at the beginning of timeslot 1 in FIG. 3 following timeslot 302, the system clock signal is shifted up in frequency to STD_CLOCK. At the conclusion of the method of FIG. 4, the system clock signal has been shifted up in frequency to a value above STD_CLOCK (block 212 of FIG. 2) for the same amount of time that it had been shifted down in frequency to a value below STD_CLOCK (block 404 of FIG. 4). As such, only negligible timing error accumulates. Such negligible timing error accumulates at a rate less than approximately 25% of one bit per second and, thus, can be corrected by the timing error correction algorithm of controller 114.

Figure 5:
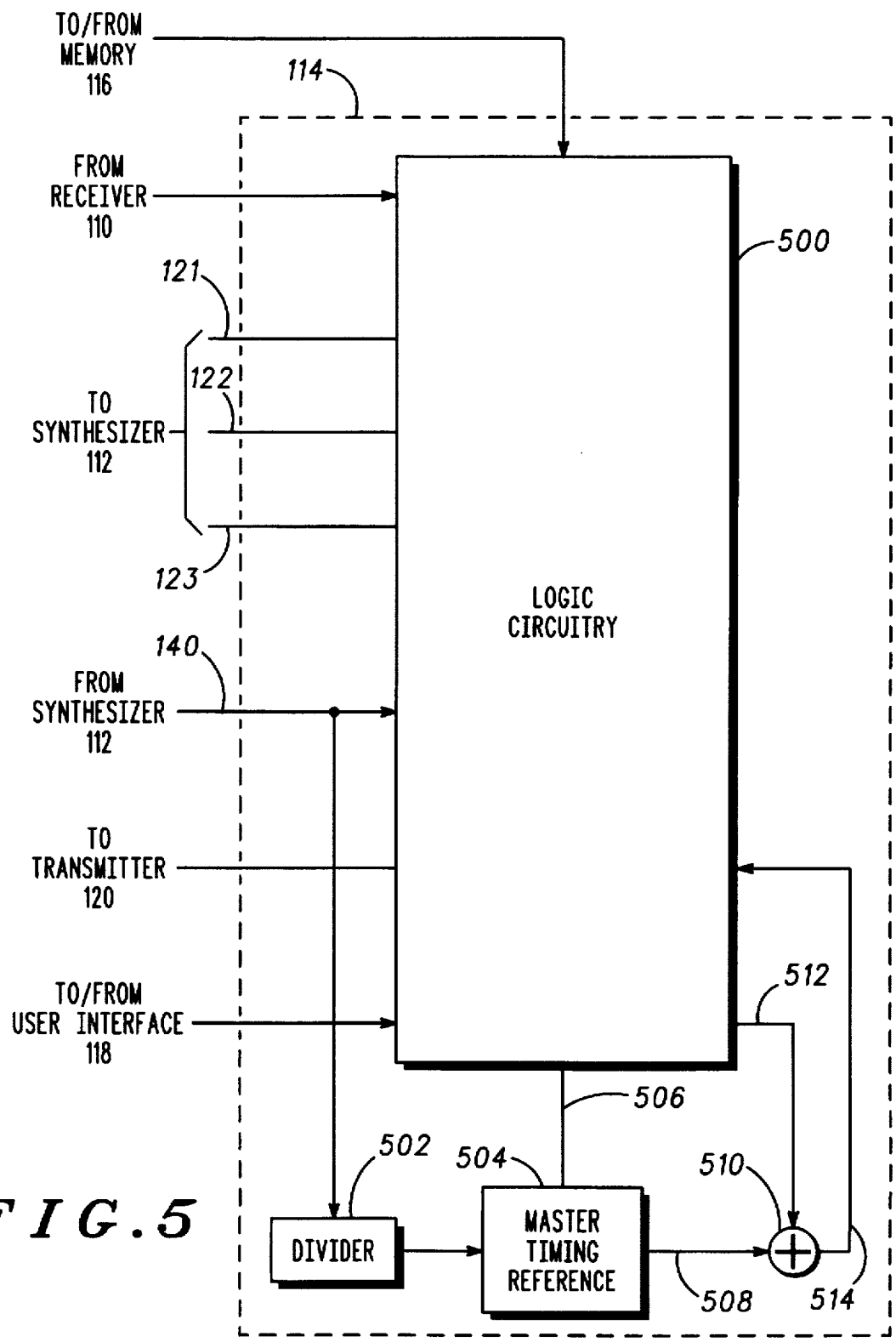
FIG. 5 is a block diagram illustrating a controller of the communication device of FIG. 1 in greater detail.

An alternate method of compensating for timing error is described in conjunction with FIG. 5. Controller 114 includes logic circuitry 500 coupled to memory 116, receiver 110, synthesizer 112 via lines 121, 122, 123, transmitter 120, and user interface 118. The elements of logic circuitry 500 operate in synchronization at a rate set by the system clock signal input via line 140. Logic circuitry 500 can include, but is not limited to, a microprocessor, a digital signal processor, a speech coder, a modulation/demodulation circuit, or the like. In addition to operating in synchronization with the system clock signal, logic circuitry 500 operates in synchronization with communication device 102 via the timing format illustrated in FIG. 3. Each frame of the timing format is comprised of a stream of bits, wherein each bit has a predetermined time period. Logic circuitry 500 tracks its time location within the frame by a master timing signal.

Controller 114 includes divider 502 and master timing reference 504 to provide the master timing signal. The system clock signal is coupled to divider 502 via line 140. Divider 502 has a fixed divider value that divides down the system clock signal to form a signal that corresponds to a duration of a quarter (25%) of a bit. At the beginning of each frame, controller 114 resets master timing reference 504 via line 506 to count the occurrences of the quarter bit signals during the frame. Master timing reference 504 outputs a master timing signal to logic circuitry 500 via line 508 that indicates the timed location within the current frame. The master timing signal has a resolution of a quarter of a bit.

When the system clock signal is shifted up in frequency in block 212 of FIG. 2 for the duration of $T_S+t_a$ per frame, the system clock signal is sped up. This in turn speeds up the master timing signal and causes timing error. As such, the master timing signal must be compensated by slowing it down. This compensation is accomplished via adder 510 of controller 114. Adder 510, coupled between master timing reference 504 and logic circuitry 500, combines the master timing signal from master timing reference 504 via line 508 with a predetermined delay value read from memory 116 via logic circuitry 500 and line 512. Adder 510 couples the delay signal to logic circuitry 500 via line 514 thereby compensating for the shift. In the illustrated embodiment, the shifting of the system clock signal results in the loss of approximately 4.5% of one bit per frame. The resolution of the master timing signal is a quarter of one bit (i.e., 25% of one bit). As such, the master timing signal should be delayed by quarters of bits. In order to apply such a delay value, the timing error must be allowed to accumulate until it reaches approximately 25% of a bit. As stated, this occurs after approximately 6 frames where the system clock signal has been shifted. As such, logic circuitry 500 will couple a quarter bit delay value from memory 116 to adder 510 after every 6 frames during which the system clock signal has been shifted. This will delay the master timing signal for a quarter of a bit, or approximately 923 ns, and compensate for the accumulated timing error.

It will be recognized that the master timing signal could alternatively be advanced via adder 510 should the system clock signal be shifted down in frequency at block 212 of FIG. 2.

Although the illustrated clock circuit 126 is used to derive the system clock signal from REF1, it will be recognized that REF1 could be directly adjusted by controller 114 via AFC2. To accomplish this, line 122 is coupled from controller 114 to reference oscillator 127. REF1 then becomes the system clock signal which is directly coupled to controller 114 and user interface 118 so as to eliminate clock circuit 126.

It will be recognized that the aforementioned apparatus and methods could alternatively be utilized to eliminate spurious signals output by transmitter 120 of FIG. 1. The system clock signal could be shifted prior to transmission of uplink RF signal 107 of FIG. 1 on any of the plurality of uplink channels susceptible to spurious signals generated by the system clock signal and logic circuitry.

Thus it can be seen that interference caused by spurious clock signals can be eliminated by shifting the system clock signal when the communication device is tuned to a channel susceptible to such signals. By employing the method and apparatus disclosed herein, prior art methods of adding material and manufacturing steps to the communication device can be avoided. Although illustrated with reference to the GSM system, it will be recognized that this method and apparatus can be employed in other communication systems, such as, for example, Advanced Mobile Phone Service (AMPS), Extended Total Access Communications System (ETACS), Narrow band Total Access Communications System (NTACS), and Nordic Mobile Telephone (NMT), or any system that suffers from system clock generated spurious signals. Accordingly, "communication system" as used herein shall refer to any such equipment and their equivalents and "communication device" to any devices used in such a system.

What is claimed is:

1. A method for eliminating interference caused by spurious signals in communication signals communicated via a communication device on any one of a plurality of different channels, the communication device operating at a rate set by a system clock signal, the method comprising the steps of:
   generating the system clock signal at a first frequency, the first frequency generating spurious signals on at least one of the plurality of different channels;
   shifting the system clock signal by a first predetermined amount to a second frequency when the communication device is to be tuned to said at least one of the plurality of different channels so as to remove the spurious signals from said at least one of the plurality of different channels;
   tuning the communication device to said at least one of the plurality of different channels; and
   compensating the rate of the communication device when the communication device has been tuned to said at least one of the plurality of different channels to prevent timing error.

2. A method according to claim 1 further comprising the step of:
   shifting the system clock signal back to the first frequency after the communication device is tuned to said at least one of the plurality of different channels.

3. A method according to claim 1 wherein the step of compensating comprises the substep of:
   shifting the system clock signal a second predetermined amount to a third frequency after the step of tuning, the second predetermined amount being a negative equivalent of the first predetermined amount.

4. A method according to claim 1 wherein the step of shifting comprises the substeps of:
   calculating a first signal having a shift value corresponding to each channel of the plurality of different channels; and
   programming a clock circuit of the communication device with the first signal, the clock circuit shifting the system clock signal according to the shift value.

5. A method for eliminating interference caused by spurious signals in communication signals communicated via a communication device on any one of a plurality of different channels, the communication device operating at a rate set by a system clock signal, the method comprising the steps of:
   generating the system clock signal at a first frequency, the first frequency generating spurious signals on at least one of the plurality of different channels;
   shifting the system clock signal by a first predetermined amount to a second frequency when the communication device is to be tuned to said at least one of the plurality of different channels so as to remove the spurious signals from said at least one of the plurality of different channels;
   tuning the communication device to said at least one of the plurality of different channels; and
   compensating the rate of the communication device when the communication device has been tuned to said at least one of the plurality of different channels to prevent timing error, the step of compensating comprising the substeps of:
   generating a master timing signal from the system clock signal; and
   delaying the master timing signal for a compensating interval.

6. A method for eliminating interference caused by spurious signals in communication signals communicated via a communication device on any one of a plurality of different channels, the communication device operating at a rate set by a system clock signal, the method comprising the steps of:
   generating the system clock signal at a first frequency, the first frequency generating spurious signals on at least one of the plurality of different channels;
   shifting the system clock signal by a first predetermined amount to a second frequency when the communication device is to be tuned to said at least one of the plurality of different channels so as to remove the spurious signals from said at least one of the plurality of different channels;
   tuning the communication device to said at least one of the plurality of different channels; and
   compensating the rate of the communication device when the communication device has been tuned to said at least one of the plurality of different channels to prevent timing error, the step of compensating comprising the substeps of:
   generating a master timing signal from the system clock signal; and
   advancing the master timing signal for a compensating interval.

7. A method for eliminating interference caused by spurious signals in communication signals communicated via a communication device on any one of a plurality of different channels, the communication device operating at a rate set by a system clock signal, the method comprising the steps of:

generating the system clock signal at a first frequency, the first frequency generating spurious signals on at least one of the plurality of different channels, the spurious signals including at least one harmonic of the system clock signal;

shifting the system clock signal a predetermined amount to a second frequency when the communication device is to be tuned to said at least one of the plurality of different channels so as to remove the at least one harmonic from said at least one of the plurality of different channels;

shifting the system clock signal back to the first frequency when the communication device is no longer to be tuned to said at least one of the plurality of different channels including the spurious signals; and compensating the communication device for said step of shifting to the second frequency so as to prevent accumulation of timing error.

8. An apparatus for eliminating interference caused by spurious signals in communication signals communicated via a communication device on any one of a plurality of different channels, the communication device operating at a rate set by a system clock signal, the apparatus comprising:

a reference oscillator to output the system clock signal at a first frequency, the first frequency generating spurious signals on at least one of the plurality of different channels; and a controller coupled to shift the system clock signal by a first predetermined amount to a second frequency when the communication device is to be tuned to said at least one of the plurality of different channels so as to remove the spurious signals from said at least one of the plurality of different channels, and to compensate the rate when the communication device has been tuned to said at least one of the plurality of different channels so as to prevent timing error.

9. An apparatus according to claim 8 wherein the controller shifts the system clock signal back to the first frequency when said at least one of the plurality of different channels is no longer to be tuned.

10. An apparatus according to claim 8 wherein the controller compensates the rate by shifting the system clock signal by a second predetermined amount to a third frequency, the second predetermined amount being a negative equivalent of the first predetermined amount.

11. An apparatus for eliminating interference caused by spurious signals in communication signals communicated via a communication device on any one of a plurality of different channels, the communication device operating at a rate set by a system clock signal, the apparatus comprising:

a reference oscillator to output the system clock signal at a first frequency, the first frequency generating spurious signals on at least one of the plurality of different channels; and a controller comprising logic circuitry, a divider, and a master timing reference, the divider coupled to receive the system clock signal, the divider coupling a divided down system clock signal to the master timing reference, the master timing reference outputting a master timing signal to the logic circuitry, the controller coupled to shift the system clock signal by a first predetermined amount to a second frequency when the communication device is to be tuned to said at least one of the plurality of different channels so as to remove the spurious signals from said at least one of the plurality of different channels.

12. An apparatus according to claim 11 wherein the controller further comprises an adder coupled between the master timing reference and the logic circuitry, the logic circuitry compensating for timing error resulting from the shift of the system clock signal to the second frequency by delaying or advancing the master timing reference for a compensating interval.

13. An apparatus for eliminating interference caused by spurious signals in communication signals communicated via a communication device on any one of a plurality of different channels, the communication device operating at a rate set by a system clock signal, the apparatus comprising:

a reference oscillator to output the system clock signal at a first frequency, the first frequency generating spurious signals on at least one of the plurality of different channels;

a controller coupled to shift the system clock signal by a first predetermined amount to a second frequency when the communication device is to be tuned to said at least one of the plurality of different channels so as to remove the spurious signals from said at least one of the plurality of different channels; and a clock circuit coupled to the reference oscillator and the controller, the clock circuit, responsive to an automatic frequency control (AFC) signal from the controller, outputting the system clock signal at the first frequency or the second frequency.

14. An apparatus according to claim 13 wherein the clock circuit includes a programmable divider coupled to the reference oscillator and the controller, the programmable divider dividing down the system clock signal to a low frequency signal.

15. An apparatus according to claim 14 wherein the clock circuit further comprises a phase-locked loop coupled to the programmable divider, the phase-locked loop, responsive to the low frequency signal from the programmable divider, outputting the system clock signal at the first frequency or the second frequency.

16. An apparatus for eliminating interference caused by spurious signals in communication signals communicated via a communication device on any one of a plurality of different channels, the communication device operating at a rate set by a system clock signal, the apparatus comprising:

reference oscillator to output the system clock signal at a first frequency the first frequency generating spurious signals on at least one of the plurality of different channels;

a controller coupled to shift the system clock signal by a first predetermined amount to a second frequency when the communication device is to be tuned to said at least one of the plurality of different channels so as to remove the spurious signals from said at least one of the plurality of different channels; and a tuning circuit coupled to the reference oscillator and the controller, the tuning circuit, responsive to a programming signal from the controller, tuning the communication device to any one of the plurality of different channels.

17. A radiotelephone comprising circuitry for eliminating interference caused by spurious signals in communication signals communicated via the radiotelephone, the radiotelephone operating at a rate set by a system clock signal, the radiotelephone comprising:

a receiver to receive the communication signals on any one of a plurality of different channels;

a tuning circuit coupled to the receiver to tune the receiver to any one of the plurality of different channels;

a reference oscillator circuit to generate a reference signal approximately equal to the system clock signal;

a clock circuit coupled to the reference oscillator circuit to adjust the reference signal and output the system clock signal at a first frequency or a second frequency, the first frequency generating spurious signals on at least one of the plurality of different channels; and a controller coupled to the clock circuit to remove the spurious signals, the controller, when the receiver is to be tuned to said at least one of the plurality of different channels, shifting the clock circuit to output the system clock signal at the second frequency, programming the tuning circuit to tune the receiver to said at least one of the plurality of different channels, shifting back the clock circuit to output the system clock signal at a second frequency, and compensating for timing error resulting from the shifting of the clock circuit.

* * * * *